United States Patent [19]

Furukawa et al.

[11] Patent Number: 4,542,105

[45] Date of Patent: Sep. 17, 1985

[54] GLASS COMPOSITION FOR COVERING SEMICONDUCTOR ELEMENT

[75] Inventors: Kazuyoshi Furukawa, Kawasaki; Masaru Shimbo, Yokohama; Kiyoshi Fukuda, Yokohama; Katsujirou Tanzawa, Yokohama, all of Japan

[73] Assignee: Tokyo Shibaura Denki Kabushiki Kaisha, Kawasaki, Japan

[21] Appl. No.: 454,248

[22] Filed: Dec. 29, 1982

[30] Foreign Application Priority Data

Jan. 21, 1982 [JP] Japan ..................... 57-7930

[51] Int. Cl.⁴ ............................ C03C 3/08; C03C 3/10
[52] U.S. Cl. ........................................ 501/22; 427/93; 501/26; 501/61; 501/62; 501/63; 501/64; 501/76
[58] Field of Search ................... 501/22, 26, 76, 61, 501/62, 63; 427/93; 428/428, 446

[56] References Cited

U.S. PATENT DOCUMENTS 3,303,399 2/1967 Hoogendoorn et al. ............. 501/61
3,950,174 4/1976 Suzuki et al. ......................... 501/76
4,133,690 1/1979 Muller ................................... 501/76

FOREIGN PATENT DOCUMENTS 49-35043  9/1974  Japan ..................... 501/22
53-37715  4/1978  Japan ..................... 501/76
54-97616  8/1979  Japan ..................... 501/76

Primary Examiner—Helen M. McCarthy
Attorney, Agent, or Firm—Oblon, Fisher, Spivak, McClelland & Maier

[57] ABSTRACT

A glass composition for covering a semiconductor element. The glass composition has excellent resistance to chemicals and excellent electric characteristics. The glass composition includes 3 to 8% by weight of $Al_2O_3$, 35 to 45% by weight of $SiO_2$, 10 to 30% by weight of ZnO, 5 to 30% by weight of PbO, 1 to 10% by weight of $B_2O_3$, and more than 5% but not exceeding 20% by weight of an alkaline earth metal oxide selected from the group consisting of MgO, CaO, SrO and BaO, where the maximum contents of MgO, CaO, SrO and BaO are 7% by weight, 3% by weight, 7% by weight, and 15% by weight, respectively.

4 Claims, No Drawings

GLASS COMPOSITION FOR COVERING SEMICONDUCTOR ELEMENT

BACKGROUND OF THE INVENTION

I. Field of the Invention

The present invention relates to a glass composition used for a semiconductor coating.

II. Description of the Prior Art

In general, a glass passivation layer is formed to cover and protect a p-n junction surface of a semiconductor element, such as a diode, a thyristor, and a transistor, which comprise monocrystalline silicon, so as to improve reliability and withstanding voltage. The following characteristics are required for a glass used as a glass passivation material:

(1) A high withstanding voltage should be imparted to a semiconductor by a glass coating. Furthermore, a leakage current should be decreased to less than a set limit when a reverse bias voltage is applied.

(2) Even if a blocking treatment (BT) is performed in which the element covered with a glass layer is reverse-biased and heat-treated, electrical characteristics of the element should not be degraded.

(3) When a glass coating is formed on the element, the element should become water-proof and have excellent resistance to acids. The semiconductor substrate should be stable during the photoetching process.

(4) The thermal expansion coefficient of a glass layer should be similar to that of silicon, thus substantially preventing glass cracking and wafer warpage.

Zinc borate (ZnO, $B_2O_3$-based) or lead silicate (PbO, $SiO_2$-based) glass has been conventionally used as a semiconductor coating glass. However, these materials do not sufficiently satisfy the above characteristics for the glass coating. In particular, zinc borate glass has poor resistance to chemicals, whereas lead silicate glass has poor electrical characteristics (especially BT characteristics).

SUMMARY OF THE INVENTION

It is, therefore, an object of the present invention to provide a glass composition for covering a semiconductor element wherein the glass composition has excellent resistance to chemicals as compared with zinc borate glass, has BT characteristics higher than those of lead silicate glass, eliminates phase separation and devitrification, and has a similar thermal expansion coefficient to that of silicon.

In order to achieve the object of the present invention, there is provided a glass composition for covering a semiconductor element, comprising 3 to 8% by weight of $Al_2O_3$, 35 to 45% by weight of $SiO_2$, 10 to 30% by weight of ZnO, 5 to 30% by weight of PbO, 1 to 10% by weight of $B_2O_3$, and more than 5% by weight and not exceeding 20% by weight of an alkaline earth metal oxide selected from the group consisting of MgO, CaO, SrO and BaO, the maximum contents of MgO, CaO, SrO and BaO being 7% by weight, 3% by weight, 7% by weight, and 15% by weight, respectively.

The glass composition according to the present invention has high resistance to chemicals, and at the same time has excellent electrical characteristics, especially temperature stability.

BRIEF DESCRIPTION OF THE DRAWING

The drawing is a sectional view of a mesa type diode manufactured for testing electrical characteristics of a glass composition of the present invention.

DETAILED DESCRIPTION OF THE PREFERRED EMBODIMENTS

The function and content of the components of a glass composition of the present invention will be described.

(1) $Al_2O_3$ $Al_2O_3$ contributes to an improvement in resistance to chemicals and control of phase separation. When its content is decreased to less than 3% by weight, phase separation and devitrification of the glass composition occur. However, when the content of $Al_2O_3$ exceeds 8% by weight, a melting point of the glass composition is raised significantly, thus disabling formation of the coating. Further, a large quantity of negative charge is induced in an interface between the silicon and the glass coating. When a reverse bias voltage is applied, a leakage current exceeds an allowable range. Therefore, an allowable content of $Al_2O_3$ falls within a range between 3% by weight and 8% by weight.

(2) $SiO_2$ $SiO_2$ is a component for improving resistance to chemicals. When the $SiO_2$ content is decreased to less than 35% by weight, a sufficient resistance to chemicals cannot be obtained. However, when the $SiO_2$ content is increased to more than 45% by weight, a melting point of the glass composition is too high to form a glass coating. Furthermore, phase separation and devitrification of the glass composition occur. Therefore, the content of $SiO_2$ is 35 to 45% by weight.

(3) ZnO

ZnO contributes to an improvement in electrical characteristics of the glass coating and to lowering of its melting temperature. When the content of ZnO is decreased to less than 10% by weight, the electrical characteristics cannot be sufficiently improved, nor can the melting point be sufficiently lowered. However, when the content of ZnO exceeds 30% by weight, devitrification of the glass composition occurs, thus resulting in an unstable composition. Therefore, an allowable content of ZnO falls within a range between 10% by weight and 30% by weight.

(4) PbO

PbO contributes to an improvement in electrical characteristics, to a lowering of the melting point of the glass, and to temperature stability of the glass coating. When the content of PbO is decreased to less than 5% by weight, the electrical characteristics cannot be sufficiently improved, the melting point of glass cannot be lowered, and a satisfactory temperature stability cannot be obtained. However, when the content of PbO exceeds 30% by weight, the electrical characteristics, and especially temperature stability, are degraded. Therefore, an allowable content of PbO falls within a range between 5% by weight and 30% by weight.

(5) $B_2O_3$ $B_2O_3$ contributes to temperature stability and to lowering the melting point of the glass composition. When the content of $B_2O_3$ is decreased to less than 1% by weight, the above objectives cannot be sufficiently achieved. However, when the content of $B_2O_3$ exceeds 10% by weight, phase separation and crystallization of the glass composition occur. Therefore, an allowable content of $B_2O_3$ falls within a range between 1% by weight and 10% by weight.

(6) MgO, CaO, SrO and BaO

These alkaline earth metal oxides contribute to the temperature stability of the glass composition and its electrical characteristics. The oxides may be used singly or in admixture with each other. When the total oxide content is 5% by weight or less, the stability of the glass composition and the improvement in electrical characteristics cannot be sufficiently accomplished. Devitrification of the glass composition occurs, resulting in an unstable composition. When a reverse bias voltage is applied, a leakage current is increased. However, when the total oxide content exceeds 20% by weight, a thermal expansion coefficient of the glass composition is increased. When the glass film is formed on silicon, cracks occur due to a difference between the thermal expansion coefficients of the glass layer and of silicon. Therefore, a total content of these alkaline earth metal oxides must be more than 5% by weight and not exceeding 20% by weight. Further, maximum contents of MgO, CaO, SrO and BaO are 7% by weight, 3% by weight, 7% by weight and 15% by weight, respectively. When the contents of the above oxides exceed the maximum contents, the thermal expansion coefficient of the glass composition is increased. When this glass composition is used to cover silicon, cracking occurs due to a difference between the thermal coefficients of the glass composition and silicon.

BaO is the most preferable oxide among the above alkaline metal oxides from the viewpoint of thermal expansion coefficients. Therefore, the content of BaO preferably exceeds 5% by weight. From the viewpoint of stability of the glass composition, more than 5% by weight of BaO and at least one of MgO, CaO and SrO should preferably be included, and a total content thereof is preferably 5.5% by weight or more.

The glass material having the above composition sufficiently satisfies the object of the present invention. However, in order to further improve electrical characteristics, an oxide is preferably mixed therewith which is selected from the group consisting of $Bi_2O_3$, $CeO_2$, $In_2O_3$, $MnO_2$, $P_2O_5$, $Sb_2O_3$, $Ta_2O_5$, $V_2O_5$ and $Y_2O_3$. These components can be used singly or in admixture with each other. When these components are mixed in the above-mentioned glass material, a leakage current upon application of a reverse bias voltage is decreased and the BT characteristics are improved. However, when a total content of the above additives or components exceeds 2% by weight, a reverse bias leakage current is inversely increased, and the devitrification of the glass composition occurs. Therefore, the total amount of the oxides is preferably 2% by weight or less.

The glass composition of the present invention is characterized in that although it has a sufficiently high resistance to chemicals, it has excellent electrical characteristics, and especially excellent temperature stability. For example, when the glass composition of the present invention is dipped in a twice-diluted aqueous solution of nitric acid at a temperature of 80° C. for 5 minutes, deterioration does not occur. Furthermore, a metal insulator semiconductor (MIS) is manufactured by a process in which a thin glass layer is formed on a silicon substrate and an aluminum electrode is deposited on the thin glass layer. When the aluminum electrode is defined as a negative terminal and a voltage $1.7 \times 10^5$ V/cm is applied thereto at a temperature of 175° C. for 10 hours, a change in interface charge is $2 \times 10^{11}/cm^2$. The lead silicate glass conventionally known withstands the above acid resistance test. However, a change in interface charge exceeds $10^{12}/cm^2$ when lead silicate glass is treated at a temperature as low as 120° C. On the other hand, zinc borate glass satisfies the interface charge test. However, zinc borate glass is etched by 1 $\mu m$ or more after one second in the acid resistance test.

The glass composition of the present invention has various excellent characteristics since the content of $SiO_2$ is great, whereas the content of PbO is small. An $SiO_2$ content in the glass is increased to improve resistance to acids. For example, the most preferable $SiO_2$ content is about 50 mol % or more. However, in ZnO-$B_2O_3$-$SiO_2$ glass, when the $SiO_2$ content is more than 20% by weight, that is, more than about 25 mol %, its glass formation range cannot be obtained. For this reason, most of the ZnO must be substituted by PbO in order to prepare a stable glass material. When the above composition is obtained, the type of glass composition is changed to $SiO_2$-PbO-$B_2O_3$ type glass, thus impairing the temperature stability of its electrical characteristics.

According to the present invention, in order to solve the dilemma described above, an alkaline earth metal oxide selected from the group consisting of MgO, CaO, SrO and BaO is added as one of the components. Alumina glazing glass is, for example, known as glass having a high content of $SiO_2$ and also including an alkaline earth metal oxide. However, since the glass composition of this type has a high thermal expansion coefficient, the glass material cannot be deposited on silicon in practice, nor can excellent electrical characteristics be obtained. As a result, the glass of this type cannot be used as a glass coating of a semiconductor. However, according to the present invention, a glass composition having various excellent characteristics can be obtained. A mixing ratio of alkaline earth metal oxides is optimized, and PbO is mixed so as not to adversely affect the electrical characteristics. Furthermore, the mixing ratio of $B_2O_3$ and $Al_2O_3$ is controlled. Even if the content of ZnO is up to a range between 10% by weight and 30% by weight, the $SiO_2$ can be stably mixed as high as a range between 35% by weight and 45% by weight. Furthermore, the thermal expansion coefficient is less than $50 \times 10^{-7}$ °C.$^{-1}$ so as to provide proper adhesion with silicon.

A conventional and widely prevailing method for manufacturing glass can be adopted as a method for manufacturing the glass composition of the present invention. Highly pure silica, alumina, boric acid, zinc white, barium carbonate, strontium carbonate, red lead, and other various oxides are weighed and mixed to obtain a target composition. The components are melted in a platinum crucible placed in an electric furnace at a temperature of generally 1,400° C. or higher. The molten mixture is stirred, and a clear molten mixture is removed from the electric furnace. The resultant mixture is granulated with water spray or by a water cooled roller and is then pulverized by a ball mill. The pulverized particles are passed through a filter to obtain a glass powder of a desired particle size.

A step of forming a glass layer on a semiconductor element is the same as in the conventional method. The glass powder obtained by the above process is coated on a desired surface portion of the semiconductor element and is sintered and densed. In the glass composition of the present invention, powder which has passed through a sieve of 325 mesh or more is coated by well known electrophoretic deposition, sedimentation or the squeezing doctor blade method. The coated powder is sintered in an oxygen atmosphere or in air at a temperature of 750° to 850° C.

EXAMPLES 1 TO 24

Oxide mixtures having different compositions as shown in Table 1 were respectively placed in platinum crucibles and were melted at a temperature of 1,420° C. for three hours. Thus, 24 types of semiconductor coating glass compositions were obtained.

The thermal expansion coefficients, the resistance to chemicals (for selected glass compositions), the withstanding voltage of the element coated with a glass composition, the initial electrical characteristics of the leakage current, and a change in leakage current due to the BT were examined for resultant glass compositions of the present invention, conventional zinc borate glass (Comparative Example 1), conventional lead silicate glass, and glass compositions (Comparative Examples 3 and 4) having the same components as the composition of the present invention, but their contents did not fall within the range of the present invention. Results are shown in Tables 1 to 4.

The thermal expansion coefficient, the resistance to chemicals, the initial electrical characteristics, and the change in leakage current were obtained by the following tests:

(1) Thermal Expansion Coefficient

A mean thermal expansion coefficient was measured at a temperature of 100° to 300° C. using an interference dilatometer.

(2) Resistance to Chemicals

One surface of each of the masses of glass compositions of Examples 1, 2, 3, 9 and 20, and Comparative Examples 1 to 4 was mirror polished. Half of the mirror surface was covered with an epoxy resin or Apiezon wax, and an exposed portion of the minor surface was etched with the chemicals shown in Table 2. A difference between the coated surface portion and the exposed surface portion was measured to determine an etching rate, thus estimating the resistance to chemicals.

(3) Initial Electrical Characteristics

Each glass composition was pulverized with a ball mill, and the glass powder passed through a filter of 325 mesh. As shown in the appended drawing, the powder of each composition was coated on a p-n junction surface of a silicon diode 1 and was sintered at a temperature of 700° to 820° C. to form a glass film 2. An aluminum electrode 3 was then deposited on the upper surface of the diode element 1. A soldered electrode 4 was formed on the lower surface of the diode element 1 to prepare a mesa type diode. A breakdown voltage and a leakage voltage when a reverse voltage of 600 V was applied were measured. Results are shown in Table 3.

(4) BT Characteristics

Diodes were prepared in the same manner as described in Initial Electrical Characteristics (3). The glass compositions of Examples 9 to 21 and Comparative Examples 1 to 4 were formed on the surface of the diodes. The BT was then performed at an applied voltage of 600 V at a temperature of 150° C. or 175° C. for 168 hours to check changes in the leakage current. Results are shown in Table 4.

TABLE 1

| | Composition (% by wt.) | | | | | | | | Others | | | | Thermal expansion coefficient ($10^{-7}$ °C.$^{-1}$) |
|---|---|---|---|---|---|---|---|---|---|---|---|---|---|
| | $Al_2O_3$ | $SiO_2$ | ZnO | PbO | $B_2O_3$ | BaO | MgO | SrO | | | | | |
| Example 1 | 3 | 43 | 25 | 10 | 5 | 10 | 2 | 2 | | | | | 46.5 |
| Example 2 | 8 | 35 | 22 | 16 | 4 | 12 | — | 3 | | | | | 47.9 |
| Example 3 | 5 | 45 | 10 | 20 | 3 | 12 | 2 | 3 | | | | | 50.0 |
| Example 4 | 4 | 37 | 30 | 5 | 7 | 15 | — | 2 | | | | | 48.0 |
| Example 5 | 5 | 40 | 18 | 30 | 1 | 5.5 | 0.5 | — | | | | | 45.7 |
| Example 6 | 4 | 40 | 20 | 10 | 10 | 15 | — | 1 | | | | | 48.0 |
| Example 7 | 6 | 38 | 21 | 11 | 4 | 15 | 3 | 2 | | | | | 49.8 |
| Example 8 | 8 | 36 | 15 | 16 | 8 | 7 | 5 | 5 | | | | | 48.6 |
| Example 9 | 6 | 40 | 23 | 15 | 4 | 10 | — | 2 | | | | | 46.2 |
| Example 10 | 6 | 40 | 22.5 | 15 | 4 | 10 | — | 2 | $Bi_2O_3$ | 0.5 | | | 46.3 |
| Example 11 | 6 | 40 | 22.5 | 15 | 4 | 10 | — | 2 | $CeO_2$ | 0.5 | | | 46.2 |
| Example 12 | 6 | 40 | 22.5 | 15 | 4 | 10 | — | 2 | $In_2O_3$ | 0.5 | | | 46.2 |
| Example 13 | 6 | 40 | 22.5 | 15 | 4 | 10 | — | 2 | $MnO_2$ | 0.5 | | | 46.0 |
| Example 14 | 6 | 40 | 22.5 | 15 | 4 | 10 | — | 2 | $P_2O_5$ | 0.5 | | | 46.3 |
| Example 15 | 6 | 40 | 22.5 | 15 | 4 | 10 | — | 2 | $Sb_2O_3$ | 0.5 | | | 46.5 |
| Example 16 | 6 | 40 | 22.5 | 15 | 4 | 10 | — | 2 | $Ta_2O_5$ | 0.5 | | | 46.1 |
| Example 17 | 6 | 40 | 22.5 | 15 | 4 | 10 | — | 2 | $V_2O_5$ | 0.5 | | | 46.3 |
| Example 18 | 6 | 40 | 22.5 | 15 | 4 | 10 | — | 2 | $Y_2O_3$ | 0.5 | | | 46.4 |
| Example 19 | 6 | 40 | 22 | 15 | 4 | 10 | — | 2 | $CeO_2$ $P_2O_5$ | 0.5 0.1 | $Sb_2O_3$ $V_2O_5$ | 0.3 0.1 | 46.4 |
| Example 20 | 6 | 40 | 19 | 25 | 4 | 6 | — | — | | | | | 42.5 |
| Example 21 | 4 | 43 | 23 | 10 | 4 | 15 | — | — | $CeO_2$ | 1 | | | 46.1 |
| Example 22 | 6 | 40 | 19 | 25 | 4 | — | 6 | — | | | | | 43.8 |
| Example 23 | 6 | 40 | 19 | 25 | 4 | — | — | 6 | | | | | 43.0 |
| Example 24 | 8 | 40 | 15 | 25 | 4 | 5 | — | — | CaO | 3 | | | 47.5 |
| Comparative Example 1 | — | 10 | 60 | 5 | 23 | — | — | — | $MnO_2$ | 1.7 | $Sb_2O_3$ | 0.3 | 47.1 |
| Comparative Example 2 | 2 | 47 | — | 42 | 9 | — | — | — | | | | | 48.0 |
| Comparative Example 3 | 6 | 37 | 30 | 20 | 1 | 5 | — | — | $Sb_2O_3$ | 1 | | | 43.2 |
| Comparative Example 4 | 8 | 35 | 22 | 28 | 4 | 3 | — | — | | | | | 44.9 |

TABLE 2

| Glass | Etching rate (μm/min) in water at 100° C. | Etching rate (μm/min) in HCl at 80° C. | Etching rate (μm/min) in HNO₃ at 80° C. | Etching rate (μm/min) in PAN* solution at 80° C. | Etching rate (μm/min) in 10% NaOH solution at 80° C. | Etching rate (μm/min) in 40% NH₄F solution at 25° C. | Etching rate (μm/min) in 2.5% HF solution at 25° C. | Etching rate (μm/min) in nonelectrolytic plating solution at 80° C.** |
|---|---|---|---|---|---|---|---|---|
| Example 1 | 0/360 | 0/15 | 0/15 | 0/15 | 0.7/1 | 0.7/1 | 2.8/1 | 0/15 |
| Example 2 | 0/360 | 0/15 | 0/15 | 0/15 | 0.4/1 | 0.8/1 | 3.1/1 | 0/15 |
| Example 3 | 0/360 | 0/15 | 0/15 | 0/15 | 0.5/1 | 0.6/1 | 2.2/1 | 0/15 |
| Example 9 | 0/360 | 0/15 | 0/15 | 0/15 | 0.6/1 | 0.7/1 | 2.8/1 | 0/15 |
| Example 20 | 0/360 | 0/15 | 0/15 | 0/15 | 0.5/1 | 0.7/1 | 3.0/1 | 0/15 |
| Comparative Example 1 | 0.2/60 | 120/0.5 | 62/9.5 | 6.4/1 | 2.4/1 | 2.4/1 | 7.4/1 | 2.2/1 |
| Comparative Example 2 | 0/360 | 0/15 | 0/15 | 0/15 | 0.2/1 | 0.2/1 | 1.6/1 | 0/15 |
| Comparative Example 3 | 0/360 | 0/360 | 0/360 | 0/360 | 0.4/1 | 0.2/1 | 1.6/1 | 0/15 |
| Comparative Example 4 | 0/360 | 0/360 | 0/360 | 0/360 | 0.3/1 | 0.2/1 | 1.3/1 | 0/15 |

*A mixture of an aluminum etching solution, consisting of 77 vol % of phosphoric acid, 15 vol % of acetic acid, 3 vol % of nitric acid, and 5 vol % of water
**Trade name BEL having a composition of 22% by weight of nickel chloride, 5% by weight of sodium hypophosphite, 49% by weight of sodium citrate, and 24% by weight of ammonium chloride, and manufactured by Kamimura Kogyo K.K.

TABLE 3

| Glass | Withstanding voltage (V) | Leakage current (nA) |
|---|---|---|
| Example 1 | 700 | 200 |
| Example 2 | 1000 | 900 |
| Example 3 | 740 | 300 |
| Example 4 | 950 | 700 |
| Example 5 | 970 | 800 |
| Example 6 | 720 | 200 |
| Example 7 | 790 | 400 |
| Example 8 | 880 | 600 |
| Example 9 | 800 | 120 |
| Example 10 | 800 | 80 |
| Example 11 | 820 | 70 |
| Example 12 | 850 | 90 |
| Example 13 | 820 | 80 |
| Example 14 | 800 | 100 |
| Example 15 | 830 | 80 |
| Example 16 | 780 | 50 |
| Example 17 | 800 | 100 |
| Example 18 | 850 | 60 |
| Example 19 | 850 | 50 |
| Example 20 | 850 | 600 |
| Example 21 | 720 | 100 |
| Example 22 | 800 | 400 |
| Example 23 | 800 | 400 |
| Example 24 | 950 | 800 |
| Comparative Example 1 | 740 | 140 |
| Comparative Example 2 | 700 | 60 |
| Comparative Example 3 | 800 | 800 |
| Comparative Example 4 | 900 | 900 |

TABLE 4

| | BT Treatment | | | | | | | |
|---|---|---|---|---|---|---|---|---|
| | 150° C. | | | | 175° C. | | | |
| Glass | Initial leakage current | Leakage current (nA) after 1 hour | Leakage current (nA) after 24 hours | Leakage current (nA) after 168 hours | Initial leakage current | Leakage current (nA) after 1 hour | Leakage current (nA) after 24 hours | Leakage current (nA) after 168 hours |
| Example 9 | 120 | 120 | 120 | 120 | 120 | 120 | 120 | 130 |
| Example 10 | 80 | 80 | 80 | 80 | 80 | 80 | 80 | 80 |
| Example 11 | 70 | 70 | 70 | 70 | 70 | 70 | 70 | 70 |
| Example 12 | 90 | 90 | 90 | 90 | 90 | 90 | 90 | 110 |
| Example 13 | 80 | 80 | 80 | 80 | 80 | 80 | 80 | 80 |
| Example 14 | 100 | 100 | 100 | 100 | 100 | 100 | 100 | 100 |
| Example 15 | 80 | 80 | 80 | 80 | 80 | 80 | 80 | 100 |
| Example 16 | 50 | 50 | 50 | 50 | 50 | 50 | 50 | 80 |
| Example 17 | 100 | 100 | 100 | 100 | 100 | 100 | 110 | 220 |
| Example 18 | 60 | 60 | 60 | 60 | 60 | 60 | 60 | 60 |
| Example 19 | 50 | 50 | 50 | 50 | 50 | 50 | 50 | 50 |
| Example 21 | 100 | 100 | 100 | 100 | 100 | 100 | 100 | 100 |
| Comparative Example 1 | 140 | 140 | 140 | 140 | 140 | 140 | 140 | 140 |
| Comparative Example 2 | 60 | 60 | 90 | 15,000 | 60 | 8,000 | 100,000 or more | — |
| Comparative Example 3 | 800 | 800 | 800 | 800 | 800 | 830 | 950 | 1,100 |
| Comparative Example 4 | 900 | 900 | 900 | 900 | 900 | 1,500 | 3,200 | 4,800 |

As may be apparent from Table 1, the glass compositions (Examples 1 to 24) of the present invention can be coated on a silicon semiconductor element since their thermal expansion coefficients are less than $5 \times 10^{-7}/°C$. which is the same as those of the compositions of Comparative Examples 1 to 4.

As may be apparent from Table 2, the glass compositions according to the present invention are not etched by water, hydrochloric acid, nitric acid, a PAN solution, or a nonelectrolytic plating solution. However, the zinc borate glass of Comparative Example 1 is etched by the above chemicals. The glass compositions of the present invention do not show the same resistance to chemicals as the composition of Comparative Example 2 when they are dipped in 40% ammonium fluoride solution, 2.5% hydrofluoric acid solution or 10% sodium hydroxide solution. However, when the glass compositions of the present invention are compared with zinc borate glass (Comparative Example 1), their etching rate is as low as ½ to 1/30 that of zinc borate glass.

As may be apparent from Table 3, the diodes respectively coated with the glass compositions of the present invention satisfy the required electrical characteristics in the same manner as the compositions of Comparative Examples 1 and 2: the breakdown voltage is 650 V and the leakage current is 1,000 nA (these are rated values).

As may be apparent from Table 4, the diodes coated with the compositions of Examples 9 to 19, 21 and Comparative Example 1 show excellent BT characteristics, since no change in leakage current occurs. However, the diode coated with the lead silicate glass of Comparative Example 2 shows an increasing leakage current when the BT is performed for 24 hours. When the BT is performed for 168 hours, the increased leakage current becomes 250 times the initial value. The leakage current of the diode coated with the lead silicate glass of Comparative Example 2 is increased to 100 times or more the initial value when the BT is performed for one hour. The increased leakage current of this diode is 1,000 times or more the initial value when the BT is performed for 24 hours. The diodes covered with the glass compositions of Examples 10, 11, 13, 18, 19 and 21, and zinc borate glass (Comparative Example 1) have substantially no increase in leakage current, and their BT characteristics are good. The diodes covered with the glass compositions of Examples 9, 12, and 14 to 17 have small increases in leakage currents which can be neglected in practice, and their BT characteristics are also good. In the diodes covered with the glass compositions which contain the same components as the compositions of the present invention but have mixing ratios outside the range of the present invention (Comparative Examples 3 and 4), excellent BT characteristics are obtained at a temperature of 150° C. However, at a temperature of 175° C., the leakage currents are increased, and the BT characteristics are degraded.

What we claim is:

1. A glass composition for covering a semiconductor element consisting essentially of 3 to 8% by weight of $Al_2O_3$, 35 to 45% by weight of $SiO_2$, 10 to 30% by weight of ZnO, 5 to 20% by weight of PbO, 3 to 10% by weight of $B_2O_3$, 12–20% by weight of alkaline earth metal oxides selected from the group consisting of MgO, CaO, SrO, and BaO, maximum contents of MgO, CaO, SrO being, respectively, 7% by weight, 3% by weight, 7% by weight, and BaO 7-15% by weight, and optionally not more than 2% by weight of an oxide selected from the group consisting of $Bi_2O_3$, $CeO_2$, $In_2O_3$, $MnO_2$, $P_2O_5$, $Sb_2O_3$, $Ta_2O_5$, $V_2O_5$ and $Y_2O_3$, the thermal expansion coeffieient of the glass composition being less than $50 \times 10^{-7}$ °C.$^{-1}$.

2. The glass composition according to claim 1, in which there is present not more than 2% by weight of an oxide selected from the group consisting of $Bi_2O_3$, $CeO_2$, $In_2O_3$, $MnO_2$, $P_2O_5$, $Sb_2O_3$, $Ta_2O_5$, $V_2O_5$ and $Y_2O_3$.

3. A process for covering a semi-conductor device, comprising: from a layer of the glass composition of claim 1 on said semi-conductor device.

4. The process of claim 3, wherein said glass composition is that of claim 2.

* * * * *